(12) United States Patent
Bourdelais et al.

(10) Patent No.: US 7,371,452 B2
(45) Date of Patent: *May 13, 2008

(54) CONDUCTIVE PATTERNED SHEET UTILIZING MULTI-LAYERED CONDUCTIVE CONDUIT CHANNELS

(75) Inventors: Robert P. Bourdelais, Pittsford, NY (US); Cheryl J. Kaminsky, Webster, NY (US); Debasis Majumdar, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/424,639

(22) Filed: Apr. 28, 2003

(65) Prior Publication Data

US 2004/0213962 A1   Oct. 28, 2004

(51) Int. Cl.
*B32B 3/20* (2006.01)
*H01B 13/00* (2006.01)
*H02G 3/04* (2006.01)

(52) U.S. Cl. ............ 428/188; 174/95; 174/96; 174/97; 174/98; 216/18; 216/19

(58) Field of Classification Search ......... 428/188, 428/170, 141, 119, 172, 161, 166, 167, 163, 428/164, 357, 358; 216/13, 18, 19; 385/132; 252/500, 510, 511, 518, 518.1; 349/79, 86, 349/88, 94, 95, 122, 124; 174/95–98; 361/679–686, 361/749–751, 784, 790; 343/762, 774, 767–771, 343/824–828, 789, 795–800

See application file for complete search history.

(56) References Cited

U.S. PATENT DOCUMENTS

| | | | |
|---|---|---|---|
| 4,008,300 A | 2/1977 | Ponn | 264/104 |
| 5,087,494 A | 2/1992 | Calhoun et al. | 428/40.1 |
| 5,220,488 A * | 6/1993 | Denes | 361/749 |
| 5,399,390 A * | 3/1995 | Akins | 428/1.62 |
| 5,522,962 A | 6/1996 | Koskenmaki et al. | 156/272.4 |
| 5,659,648 A | 8/1997 | Knapp et al. | 385/129 |
| 5,917,567 A | 6/1999 | Oh et al. | 349/113 |
| 6,124,974 A | 9/2000 | Burger | 359/621 |
| 6,285,001 B1 | 9/2001 | Fleming et al. | 219/121.72 |
| 6,548,159 B2 * | 4/2003 | Tsai et al. | 428/325 |
| 6,591,496 B2 * | 7/2003 | Koskenmaki et al. | 29/846 |
| 2002/0197554 A1 | 12/2002 | Wolk et al. | 430/200 |
| 2003/0122111 A1* | 7/2003 | Glatkowski | 252/500 |
| 2003/0197648 A1* | 10/2003 | Quinn et al. | 343/702 |
| 2003/0231819 A1 | 12/2003 | Palmer et al. | 385/14 |

* cited by examiner

*Primary Examiner*—Patricia L. Nordmeyer
(74) *Attorney, Agent, or Firm*—Arthur E. Kluegel

(57) ABSTRACT

Disclosed is an article comprising a polymer layer containing a plurality of integral polymer conduit channels that contain at least two layers with at least one comprising a conductive material and the other serving a function beyond protection.

34 Claims, 1 Drawing Sheet

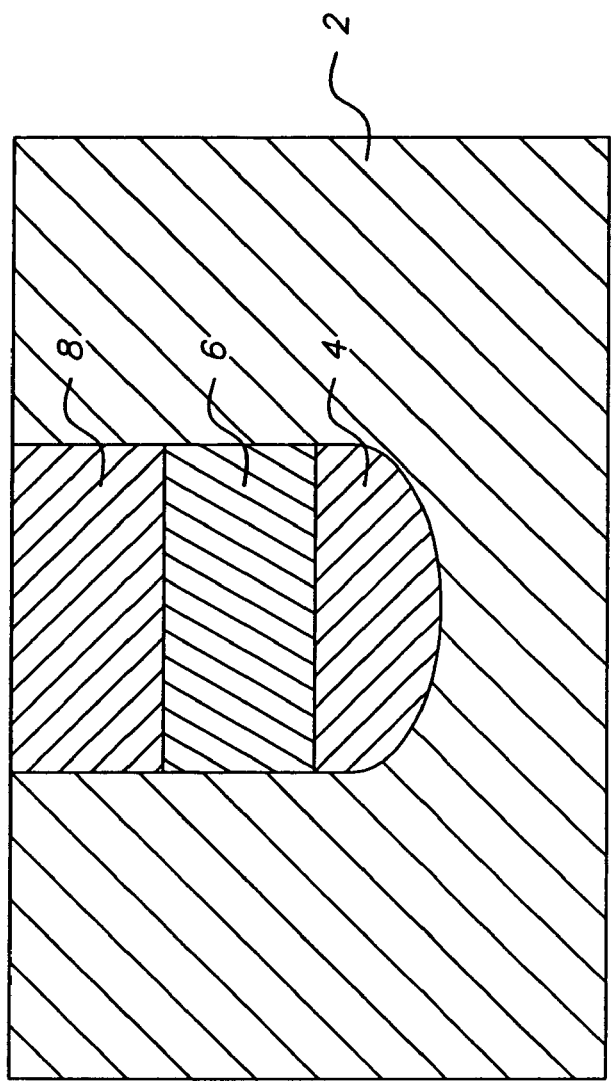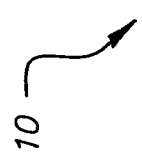

CONDUCTIVE PATTERNED SHEET UTILIZING MULTI-LAYERED CONDUCTIVE CONDUIT CHANNELS

CROSS REFERENCE TO RELATED APPLICATIONS

This application is one of a group of four applications co-filed under U.S. application Ser. No. 10/424,666, now U.S. Pat. No. 7,001,658 on Feb. 21, 2006; Ser. Nos. 10/425,005; 10/424,639; and 10/425,012, now U.S. Pat. No. 7,138,170 on Nov. 21, 2006, all filed on Apr. 28, 2003.

FIELD OF THE INVENTION

The invention relates to a transparent patterned conductive sheet aligned to form conduits in the plane of the conductive sheet.

BACKGROUND OF THE INVENTION

As electronic devices become smaller, the requirements for precise electrical connection at extremely fine pitch continue to increase. As an example, semiconductors, such as integrated circuits, are formed on wafers that are then cut into dice or chips that individually may be mounted on substrates. Typically, the substrate has fine electrically conductive circuit lines, and electrical and thermal contact must be made between the substrate and chip. As electronic appliances, such as computers, tape players, televisions, telephones, and other appliances become smaller, thinner, and more portable, the size requirements for semiconductors and the means for providing electrical connection between semiconductors and substrates, or between flexible circuits and rigid printed circuits, become increasingly demanding.

Prior art conductive sheet typically comprise a single layer of material to conduct electrical current or signals. The single layer typically comprises a single layer of conductive ink, metallic layer or a coating of a conductive material in a channel as multiple layers are expensive and difficult to register. There remains a need to provide multiple patterned layers in order to provide conductive sheet that both are patterned conductive and wave guide in the plane of the conductive sheet.

One method for providing electrical conductivity between two electrical elements, is through the use of a Z-axis conductive sheet material, such as a Z-axis adhesive. Whether the sheet material is an elastomer or an adhesive, the continuing challenge is to keep pace with the miniaturization in the electronics industry. Z-axis conductivity can be achieved through a number of means, including dispersing conductive particles throughout a binder matrix. Where electrical connection on a very fine pitch is required, the conductive elements may be placed only where the electrodes are located, typically requiring indexing the conductive sheet to the electrodes, or the conductive elements may be placed at such close spacing, relative to the spacing of the electrodes, that indexing is not required. U.S. Pat. No. 5,087,494, (Calhoun et al) is an example of an electrically conductive adhesive tape having conductive particles placed at precise locations, on a fine pitch. The Calhoun et al '494 patent also discusses a number of available options for electrically conductive adhesive tapes.

U.S. Pat. No. 4,008,300 (Ponn) and U.S. Pat. No. 3,680,037 (Nellis, et al.), teach a dielectric sheet material having a plurality of compressible resilient conductive plugs that extend between the faces of the sheet. The sheet can be placed between circuits to make electrical connection there between. The conductive plugs of Ponn and Nellis are dispersions of conductive particles in a binder material.

Other patents teach orienting magnetic particles dispersed in a binder by applying a magnetic field, e.g., U.S. Pat. No. 4,448,837 (Ikade, et al.); U.S. Pat. No. 4,546,037 (King); U.S. Pat. No. 4,548,862 (Hartman); U.S. Pat. No. 4,644,101 (Jin, et al.); and U.S. Pat. No. 4,838,347 (Dentinni). The distribution of the particles after orientation and curing is sufficiently uniform to be functional for certain applications, but is insufficient for other applications. If the number of particles used in these articles were to be increased in an attempt to reach smaller spacings for finer pitch connections, agglomeration would likely occur thereby causing shorting. Accordingly, there is a need for a fine pitch means of providing electrical interconnection between two surfaces in a precise manner, at an extremely fine pitch.

U.S. Pat. No. 5,522,962 teaches conductive sheets that are conductive through the thickness but insulating in the lateral directions. While a conductive materials are disclosed, they tend to have low light transmission and therefore are not particularly useful in transmission devices such as liquid crystal displays. Further, the conductive materials utilized in the invention are conductive ferromagnetic particles coated in a binder.

One known prior process for preparing chill rollers involves creating a main surface pattern using a mechanical engraving process. The engraving process has many limitations including misalignment causing tool lines in the surface, high price, and lengthy processing. Accordingly, it is desirable to not use mechanical engraving to manufacture chill rollers.

The U.S. Pat. No. 6,285,001 (Fleming et al) relates to an exposure process using excimer laser ablation of substrates to improve the uniformity of repeating microstructures on an ablated substrate or to create three-dimensional microstructures on an ablated substrate. This method is difficult to apply to create a master chill roll to manufacture complex random three-dimensional structures and is also cost prohibitive.

In U.S. Pat. No. 6,124,974 (Burger) the substrates are made with lithographic processes. This lithography process is repeated for successive photomasks to generate a three-dimensional relief structure corresponding to the desired lenslet. This procedure to form a master to create three-dimensional features into a plastic film is time consuming and cost prohibitive.

Conductive layers containing electronic conductors such as conjugated conducting polymers, conducting carbon particles, crystalline semiconductor particles, amorphous semiconductive fibrils, and continuous semiconducting thin films can be used more effectively than ionic conductors to dissipate static charge since their electrical conductivity is independent of relative humidity and only slightly influenced by ambient temperature.

Of the various types of electronic conductors, electrically conducting metal-containing particles, such as semiconducting metal oxides, are particularly effective when dispersed in suitable polymeric film-forming binders in combination with polymeric non-film-forming particles as described in U.S. Pat. Nos. 5,340,676; 5,466,567; 5,700,623. Binary metal oxides doped with appropriate donor heteroatoms or containing oxygen deficiencies have been disclosed in prior art to be useful in antistatic layers for photographic elements, for example, U.S. Pat. Nos. 4,275,103; 4,416,963; 4,495,276; 4,394,441; 4,418,141; 4,431,764; 4,495,276; 4,571,361; 4,999,276; 5,122,445; 5,294,525; 5,382,494;

5,459,021; 5,484,694 and others. Suitable claimed conductive metal oxides include: zinc oxide, titania, tin oxide, alumina, indium oxide, silica, magnesia, zirconia, barium oxide, molybdenum trioxide, tungsten trioxide, and vanadium pentoxide. Preferred doped conductive metal oxide granular particles include antimony-doped tin oxide, fluorine-doped tin oxide, aluminum-doped zinc oxide, and niobium-doped titania. Additional preferred conductive ternary metal oxides disclosed in U.S. Pat. No. 5,368,995 include zinc antimonate and indium antimonate. Other conductive metal-containing granular particles including metal borides, carbides, nitrides and suicides have been disclosed in Japanese Kokai No. JP 04-055,492.

U.S. Pat. Nos. 6,077,655; 6,096,491; 6,124,083; 6,162,596; 6,187,522; 6,190,846; and others describe imaging elements, including motion imaging films, containing electrically conductive layers comprising conductive polymers. One such electrically-conductive polymer comprises an electrically conductive 3,4-dialkoxy substituted polythiophene styrene sulfonate complex.

PROBLEM TO BE SOLVED BY THE INVENTION

There remains a need for an electrically conductive sheet that is transparent for use in transmitted display devices and contains two or more layers serving a function beyond protection.

SUMMARY OF THE INVENTION

The invention provides an article comprising a polymer layer containing a plurality of integral polymer conduit channels that contain at least two layers with at least one comprising a conductive material and the other serving a function beyond protection. The invention also provides a method for forming such an article and a transparent display containing such an article.

ADVANTAGEOUS EFFECT OF THE INVENTION

The invention provides improved light transmission while simultaneously providing conductive conduit channels. The channels contain at least two layers that serve functions beyond protection. For example, the invention provides a sheet that is both electrically conductive in the plane of the sheet and functions to guide light waves in the plane of the sheet.

BRIEF DESCRIPTION OF THE DRAWINGS

The FIGURE illustrates multi-layered conductive conduit channels that are capable of guiding light in the plane of the sheet.

DETAILED DESCRIPTION OF THE INVENTION

The FIGURE illustrates multi-layered conductive conduit channels 10 that are capable of guiding light in the plane of the sheet. Transparent polymer base sheet 2 contains a U-shaped conduit. The U-shaped conduit contains three coated layers. The bottom most layer 4 is an electrically conductive transparent polymer. Layer 6 is an electrically insulating transparent polymer that has an index of refraction that is at least 0.12 greater than the polymer used for base sheet 2 and the electrically conductive layers 4 and 8. Layer 8 is an electrically conductive transparent polymer. Electrical signals or current can move independently in layers 4 and 8 because they are electrically insulated by layer 6. Visible light energy can be guided in layer 6 (because of the index of refraction difference between layers 4 and 6/8) independent of the electrical signals or current flow in layers 4 and 8. Incident light energy on multi-layered transparent conductive conduit 10 is transmitted through both base sheet 2 and the conductive layers 4, 6 and 8.

The invention has numerous advantages over prior practices in the art. The invention provides an electrically conductive sheet material that is conductive in the plane of the sheet while being transparent to light energy perpendicular to the direction of the sheet. Conductive conduits, which are spaced by insulating thermoplastic in lateral directions, provide precision pathways for conducting of electricity from an origination point to the destination. Conducting sheet that are patterned and are transparent to visible light can be used for membrane switches, radio frequency antenna, display devices, connections between semiconductors and substrates or between flexible circuits and rigid printed circuits. Because the conductive material is transparent, the sheet of the invention may also be utilized in combination with imaging layers such as ink jet printed images.

The conduit channels are located below the grade or upper surface of the polymer sheet. The conduits, which are desirably formed from electrically insulating thermoplastic, can be formed in a variety of sizes and shapes to provide the desired input and output characteristics. Because the conduit channels are formed from thermoplastic, the conduits can also have a variety of orientations such as conduits that are perpendicular to each other, conduits which curve, circular conduits or conduits that are connected at some logical point.

The conduits of the invention contain two or more layers in the conduit channels. Two or more layers contained in the conduits can allow for light to be wave guided in the plane of the sheet. Wave guiding light in the plane of the sheet allows for the conductive sheet to be both electrically conductive and wave guide light. An example of a light and electrically conductive conduits is a rear illuminated membrane switch. The switch can be rear illuminated to function when ambient lighting is low and can direct the light to areas of the switch, such as the on/off button, that are critical to the performance of the switch. Further, since the waveguide is in the plane of the sheet, the switch can be illuminated along the perimeter of the sheet saving space and weight for a switch device.

Two or more layers located in the conduits of the invention also allow several conductive layers to be utilized in the same space, each layer (separated by an electrical insulating layer) carrying current or electrical signals. Multiple layers allow for redundant conductive channels increasing the reliability of the conductive sheet. Improved reliability is particularly important for military devices or devices that impact public safety.

The conductive conduits of the invention provide protection to the electrically conductive material contained in the conduits. By protecting the conductive material of the invention, scratching, abrasion, and contamination of the electrically conductive material are greatly reduced compared to prior art conductive patterns that reside of the surface of a substrate. Scratching of the conductive material could result in an unwanted disruption of in the conductivity of one or more conduits resulting in device failure. Because the conductive material of the invention is contained with conduits, the coating is further protected with an auxiliary coating, creating a coating surface for cholesteric liquid crystals for example.

While thermoplastic materials offer good chemical and heat resistance, the addition of nano-composite materials such as clay to the conduits further improve the heat resistance, electrical insulation properties and abrasion resistance while not significantly reducing the transmission properties of the conductive sheet. By adding pigments or dyes to either the conductive conduits or the insulating thermoplastic structures that contain the conductive materials, the conductive sheet of the invention can provide colored transmission light energy or contain a pattern such as the word "stop" as in a stop sign. These and other advantages will be apparent from the detailed description below.

The term "LCD" means any rear projection display device that utilizes liquid crystals to form the image. The term "diffuser" means any material that is able to diffuse specular light (light with a primary direction) to a diffuse light (light with random light direction). The term "light" means visible light. The term "diffuse light transmission" means the percent diffusely transmitted light at 500 nm as compared to the total amount of light at 500 nm of the light source. The term "total light transmission" means percentage light transmitted through the sample at 500 nm as compared to the total amount of light at 500 nm of the light source. This includes both spectral and diffuse transmission of light. The term "diffuse light transmission efficiency" means the ratio of % diffuse transmitted light at 500 nm to % total transmitted light at 500 nm multiplied by a factor of 100. The term "polymeric film" means a film comprising polymers. The term "polymer" means homo- and co-polymers. The term "average", with respect to lens size and frequency, means the arithmetic mean over the entire film surface area.

The term "Transparent" means a sheet with total light transmission of 70% or greater at 500 nm. The term "Conduit" means a trench, furrow or groove in the sheet of the invention. The conduits in the sheet contain the conductive materials of the invention. The conduits range in thickness between 0.5 and 100 micrometers. The conduits have a general direction in the plane of the sheet, although the conduit can vary in the depth of the sheet. Conduits in the plane of the sheet can be ordered rows or arrays, random in nature, straight, curved, circular, oval, square, triangular, sine waves, or square waves. The conduits generally start with an origination point and end at a termination point. The conduits may be discrete or may intersect. In the sheet, there may be one or more conduits. The conduit frequency in any direction ranges from one conduit/cm to 1000 conduits/cm.

The term conductive means the ability of a material to conduct electrical current. Conductivity is the reciprocal of resistivity. Resistivity is measured in units of ohm-meters. A common way of referring to surface resistance of a conductive layer coated on a substrate is by the term surface electrical resistance or SER. SER is measured in units of ohms/square. Conductive materials utilized in this invention generally have resistivity of less than 5000 ohm-meters. Conductive layers utilized in this invention generally have measured SER of less than 5000 ohms/square.

In order to provide a sheet that is both electrically and optically conductive, an article comprising a polymer layer containing a plurality of integral polymer conduits contains at least two layers with at least one comprising a conductive material. Two or more layers are preferred as multiple layers can be useful for improving the reliability of a device by adding redundant conductive layers, allowing the invention to efficiently guide light in the plane of the sheet and allowing one conduit to have several electrical and/or optical functions.

The conductive material of the invention preferably comprises two or more distinctive layers. Distinct layers are preferred because they are separate from each other and can contain separate functionalities such as resistivity, band width or heat transfer. In a preferred embodiment of the invention, two conductive materials are separated by an electrical insulating layer with a conductivity greater than 5,000 ohms/cm. By electrically insulating two or more layers, the layers can provide redundancy, separate functionality or change the properties of the resulting magnetic and electrical fields. Examples of electrically insulating materials include non conducting polymers such as olefins, acrylic and polyurethane.

In another preferred embodiment of the invention, the 2 or more layers have a conductivity difference of greater than 200 ohms/cm. By creating a conductivity difference if greater than 200 ohms/cm the properties of magnetic and electrical fields can be changed as a function of magnetic flux and current flow. Patterned magnetic and electrical fields have been shown to change the properties of liquid crystals, changing their orientation in a polymer matrix for example.

In another preferred embodiment of the invention, the two or more layers differ in refractive index by at least 0.10. By creating a index of refraction of at least 0.10, light energy can be guided in the plane of the sheet. In plane light guiding is particularly useful for illuminating display members or as security devices. An example would be a polymer conduit comprising an olefin polymer with an index of refraction of 1.49. A first layer of polycarbonate polymer with an index of refraction of 1.59 applied to the bottom of the conduit and a second layer of an olefin polymer with an index of refraction of 1.49 is applied to surface of the polycarbonate polymer. Red light originating from a LED light source in optical contact with the polycarbonate layer is efficiently guided the length of the polymer conduit creating a transparent light guide.

The light guiding layer has polymer layers on either side of the polymer light guiding layer to create an optical wave guide in which the light guiding layer acts as the core and the polymer layers on both sides of the light guiding layer act as cladding. The light guiding layer is made from a light transmitting material. The cladding surrounds the core and has an index of refraction that is less than the index of refraction of the core. Such an arrangement typically results in substantial internal reflection of light traveling through the core. The internal reflection of light occurs when light traveling down the core is reflected back towards the center of the core as the light encounters the inner surface of the cladding. The efficiency of the optical wave guide decreases if the cladding layer is smaller than the core layer be less than 0.03. The cladding can also be a reflective layer. Having a reflective layer (such as metal) surrounding the light guiding layer acts like a mirror and keeps most of the light in the light guiding layer making a very efficient light guide (also called a wave guide).

A variety of materials can be used to form the light guiding layer and the cladding. The light guiding layer is typically formed from a polymeric material, including, for example methacrylates, such as n-butyl methacrylate and 2-ethylhexyl methacrylate. In particular, one suitable core material includes a 1:1 mixture by weight of n-butyl methacrylate and 2-ethylhexyl methacrylate, which, in turn, can contain 0.05% by weight triethylene glycol dimethacrylate crosslinking agent and 0.2% by weight di(4-t-butylcyclohexyl)peroxydicarbonate (Perkadox 16.TM., Akzo Nobel Chemicals, Inc., Chicago, Ill.) thermal initiator. Additional materials and examples are presented in U.S. Pat. No. 5,225,166, incorporated herein by reference.

The layers surrounding the light guiding layer, or cladding, can be formed from a variety of different compounds. Polymers are preferred as they are cheap and easily processable. As an example, fluoropolymers have been found to be useful as a cladding for the light guiding layer.

In another preferred embodiment, the two or more layers are separated by an adhesive layer. An adhesive layer is preferred because it allows two or more layers that have poor adhesion to be adhered in the conduits. An example would be polypropylene polymer and polyester polymer. An adhesive is also preferred when the surface energy of the layers is below 40 dynes/cm. Examples of inorganic preferred pressure sensitive adhesives are soluble silicates, ceramic and thermosetting powdered glass. Organic pressure sensitive adhesives may be natural or synthetic. Examples of preferred natural organic pressure sensitive adhesives include bone glue, soybean starch cellulosics, rubber latex, gums, terpene, mucilages and hydrocarbon resins. Examples of synthetic organic pressure sensitive adhesives include elastomer solvents, polysulfide sealants, thermoplastic resins such as isobutylene and polyvinyl acetate, thermosetting resins such as epoxy, phenol-formaldehyde, polyvinyl butyral and cyanoacrylates and silicone polymers.

For single or multiple layer pressure sensitive adhesive systems, the preferred pressure sensitive adhesive composition is selected from the group consisting of natural rubber, synthetic rubber, acrylics, acrylic copolymers, vinyl polymers, vinyl acetate-, urethane, acrylate-type materials, copolymer mixtures of vinyl chloride-vinyl acetate, polyvinylidene, vinyl acetate-acrylic acid copolymers, styrene butadiene, carboxylated stryrene butadiene copolymers, ethylene copolymers, polyvinyl alcohol, polyesters and copolymers, cellulosic and modified cellulosic, starch and modified starch compounds, epoxies, polyisocyanate, polyimides.

In another preferred embodiment of the invention one of the two or more layers in the conduits comprises a dielectric materials. Two conductive layers separated by a dielectric creates a capacitor. Capacitors store electrical energy and the charge is stored partly by polarization of the particles in the dielectric material. The capacitance of the capacitor increases as a function of the common area of the conductive material, the distance between the conductive materials and the relative permittivity of the dielectric. Preferred dielectric materials comprise polymer because they can be easily solution coated into the channels and the thickness of the dielectric can be controlled to high precision thus creating a high precision capacitor.

In another preferred embodiment of the invention, the two or more layers comprises a gradient. The gradient in the conduits can be in the plane of the sheet, increasing or decreasing the width of the conduits or the gradient can occur in the depth of the sheet. Gradients are preferred as the conductive nature of the conduits can change allowing for electrical signal manipulation, variable capacitance, and variable resistance. The gradient of the invention is also preferred because it allows wave guided light energy that originates at the perimeter of the sheet to be directed in a direction that is perpendicular to the sheet.

In another preferred embodiment of the invention, two or more layers in the conduits are separated by a diffusion membrane. A diffusion membrane is preferred because the membrane allows for the controlled diffusion of materials from one layer to adjacent layers in the conduits. A useful example is the application of a desiccant layer, a water diffusion membrane and water sensitive chemistry. Unwanted water would diffuse through the membrane into the desiccant layer improving the performance of the water sensitive layer.

Control of the environment within a packaged electronic device (such as a MEMS device, CCD sensor, or OLED) is typically achieved by encapsulating the device or by sealing the device and a desiccant within a cover. Desiccants such as, for example, molecular sieve materials, silica gel materials, and materials commonly referred to as Drierite materials are used to maintain the humidity level within the above range. Selection of a desiccant and the method of applying a selected desiccant to an inner portion of a device enclosure prior to sealing the device within or by the enclosure is governed by the type of device to be protected from moisture. For example, highly moisture-sensitive organic light-emitting devices or polymer light-emitting devices require the selection of particular desiccants and methods of application, since organic materials or organic layers are integral constituents of such devices. The presence of organic materials or layers may, for example, preclude the use of certain solvents or fluids in the application of a desiccant dispersed in a fluid to organic-based devices. Currently preferred solid desiccants are selected from the group consisting of alkaline metal oxides, alkaline earth metal oxides, sulfates, metal chlorides, and perchlorates. Currently preferred moisture-permeable binders are selected from the group consisting of cellulose acetates, epoxys, phenoxys, siloxanes, methacrylates, sulfones, phthalates, and amides.

In order to provide a sheet that is patterned conductive to electrical current and be transparent to visible light energy, an article comprising a polymer layer containing a plurality of integral polymer conduits containing a substantially transparent conductive material is preferred. The polymer conduits provide electrical insulation between the conduits and the material contained in the conduits is both transparent and electrically conductive. Because the material in the conduits is both conductive and transparent, the article of the invention can be utilized in application that required electrically conductive properties and transparency to visible light. Examples of the utility of the sheet containing a plurality of conduits containing a transparent, conductive materials include simple displays that use a coated layer of cholesteric liquid crystals in which the electrical field of the energized conduits changes the orientation of the cholesteric liquid crystals, rear illuminated watch electronics in which illumination light energy is transmitted through the conductive conduits and transparent hidden radio frequency antenna.

A preferred conductive material comprises a conductive polymer. Conductive polymers are preferred because they contain the desired visible light transparency properties, can be easily coated roll to roll in the conduits compared to prior art metallic conductors which utilize vacuum deposition methods for application, have resistivity of less than 5000 ohm meter and more typically in the 0.01 to 5000 ohm meter range and can contain addenda such as a transparent dye. Additionally, the conductive polymer of the invention have been shown to have excellent adhesion to the bottom of the polymer conduits located in the depth of the polymer sheet.

In order to provide electrically conductive conduits that have a high visible light transmission conductive polymers selected from the group consisting of substituted or unsubstituted aniline containing polymers, substituted or unsubstituted pyrrole containing polymers, substituted or unsubstituted thiophene containing polymers. The above polymers provide the desired conductivity, adhesion to the conduits and have high light transmission.

Among the aforesaid electrically conductive polymers, the ones based on polypyrrole and polythiophene are particularly preferred as they provide optimum electrical and optical properties. A particularly preferred electrically conductive polymer for the present invention is polythiophene based, mainly because of its commercial availability in large quantity.

The electrically conductive material of the present invention is preferably coated from a coating composition comprising a polythiophene/polyanion composition containing an electrically conductive polythiophene with conjugated polymer backbone component and a polymeric polyanion component. A preferred polythiophene component for use in accordance with the present invention contains thiophene nuclei substituted with at least one alkoxy group, e.g., a $C_1$-$C_{12}$ alkoxy group or a —$O(CH_2CH_2O)_nCH_3$ group, with n being 1 to 4, or where the thiophene nucleus is ring closed over two oxygen atoms with an alkylene group including such group in substituted form. Preferred polythiophenes for use in accordance with the present invention may be made up of structural units corresponding to the following general formula (I)

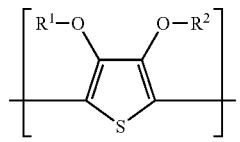

in which: each of $R^1$ and $R^2$ independently represents hydrogen or a $C_{1-4}$ alkyl group or together represent an optionally substituted $C_{1-4}$ alkylene group, preferably an ethylene group, an optionally alkyl-substituted methylene group, an optionally $C_{1-2}$ alkyl- or phenyl-substituted 1,2-ethylene group, 1,3-propylene group or 1,2-cyclohexylene group. The preparation of electrically conductive polythiophene/polyanion compositions and of aqueous dispersions of polythiophenes synthesized in the presence of polyanions, as well as the production of antistatic coatings from such dispersions is described in EP 0 440 957 (and corresponding U.S. Pat. No. 5,300,575), as well as, for example, in U.S. Pat. Nos. 5,312,681; 5,354,613; 5,370,981; 5,372,924; 5,391,472; 5,403,467; 5,443,944; and 5,575,898, the disclosures of which are incorporated by reference herein.

The preparation of an electrically conductive polythiophene in the presence of a polymeric polyanion compound may proceed, e.g., by oxidative polymerization of 3,4-dialkoxythiophenes or 3,4-alkylenedioxythiophenes according to the following general formula (II):

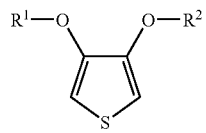

wherein: $R^1$ and $R^2$ are as defined in general formula (I), with oxidizing agents typically used for the oxidative polymerization of pyrrole and/or with oxygen or air in the presence of polyacids, preferably in aqueous medium containing optionally a certain amount of organic solvents, at temperatures of 0° to 1000° C. The polythiophenes get positive charges by the oxidative polymerization, the location and number of said charges is not determinable with certainty and therefore they are not mentioned in the general formula of the repeating units of the polythiophene polymer. When using air or oxygen as the oxidizing agent their introduction proceeds into a solution containing thiophene, polyacid, and optionally catalytic quantities of metal salts till the polymerization is complete. Oxidizing agents suitable for the oxidative polymerization of pyrrole are described, for example, in J. Am. Soc. 85, 454 (1963). Inexpensive and easy-to-handle oxidizing agents are preferred such as iron(III) salts, e.g. $FeCl_3$, $Fe(ClO_4)_3$ and the iron(III) salts of organic acids and inorganic acids containing organic residues, likewise $H_2O_2$, $K_2Cr_2O_7$, alkali or ammonium persulfates, alkali perborates, potassium permanganate and copper salts such as copper tetrafluoroborate. Theoretically, 2.25 equivalents of oxidizing agent per mol of thiophene are required for the oxidative polymerization thereof [ref. J. Polym. Sci. Part A, Polymer Chemistry, Vol. 26, p. 1287 (1988)]. In practice, however, the oxidizing agent is used in a certain excess, for example, in excess of 0.1 to 2 equivalents per mol of thiophene.

For the polymerization, thiophenes corresponding to the above general formula (II), a polyacid and oxidizing agent may be dissolved or emulsified in an organic solvent or preferably in water and the resulting solution or emulsion is stirred at the envisaged polymerization temperature until the polymerization reaction is completed. The weight ratio of polythiophene polymer component to polymeric polyanion component(s) in the polythiophene/polyanion compositions employed in the present invention can vary widely, for example preferably from about 50/50 to 15/85. By that technique stable aqueous polythiophene/polyanion dispersions are obtained having a solids content of 0.5 to 55% by weight and preferably of 1 to 10% by weight. The polymerization time may be between a few minutes and 30 hours, depending on the size of the batch, the polymerization temperature and the kind of oxidizing agent. The stability of the obtained polythiophene/polyanion composition dispersion may be improved during and/or after the polymerization by the addition of dispersing agents, e.g. anionic surface active agents such as dodecyl sulfonate, alkylaryl polyether sulfonates described in U.S. Pat. No. 3,525,621. The size of the polymer particles in the dispersion is typically in the range of from 5 nm to 1 μm, preferably in the range of 40 to 400 nm.

Polyanions used in the synthesis of these electrically conducting polymers are the anions of polymeric carboxylic acids such as polyacrylic acids, polymethacrylic acids or polymaleic acids and polymeric sulfonic acids such as polystyrenesulfonic acids and polyvinylsulfonic acids, the polymeric sulfonic acids being those preferred for this invention. These polycarboxylic and polysulfonic acids may also be copolymers of vinylcarboxylic and vinylsulfonic acids with other polymerizable monomers such as the esters of acrylic acid and styrene. The anionic (acidic) polymers used in conjunction with the dispersed polythiophene polymer have preferably a content of anionic groups of more than 2% by weight with respect to said polymer compounds to ensure sufficient stability of the dispersion. The molecular weight of the polyacids providing the polyanions preferably is 1,000 to 2,000,000, particularly preferably 2,000 to 500,000. The polyacids or their alkali salts are commonly available, e.g., polystyrenesulfonic acids and polyacrylic acids, or they may be produced based on known methods.

Instead of the free acids required for the formation of the electrically conducting polymers and polyanions, mixtures of alkali salts of polyacids and appropriate amounts of monoacids may also be used.

While general synthesis procedures and compositions are described above, the polythiophene/polyanion compositions employed in the present invention are not new themselves, and are commercially available. Preferred electrically-conductive polythiophene/polyanion polymer compositions for use in the present invention include 3,4-dialkoxy substituted polythiophene/poly(styrene sulfonate), with the most preferred electrically-conductive polythiophene/polyanion polymer composition being poly(3,4-ethylene dioxythiophene)/poly(styrene sulfonate), which is available commercially from Bayer Corporation as Baytron P.

The other preferred electrically conductive polymers include poly(pyrrole styrene sulfonate) and poly(3,4-ethylene dioxypyrrole styrene sulfonate) as disclosed in U.S. Pat. Nos. 5,674,654; and 5,665,498; respectively.

Any polymeric film-forming binder, including water soluble polymers, synthetic latex polymers such as acrylics, styrenes, acrylonitriles, vinyl halides, butadienes, and others, or water dispersible condensation polymers such as polyurethanes, polyesters, polyester ionomers, polyamides, epoxides, and the like, may be optionally employed in the conductive layer to improve integrity of the conductive layer. Preferred binders include polyester ionomers, vinylidene chloride containing interpolymers and sulfonated polyurethanes as disclosed in U.S. Pat. No. 6,124,083 incorporated herein by reference. The electrically-conductive polythiophene/polyanion composition to added binder weight ratio can vary from 100:0 to 0.1:99.9, preferably from 1:1 to 1:20, and more preferably from 1:2 to 1:20. The dry coverage of the electrically-conductive substituted or unsubstituted thiophene-containing polymer employed depends on the inherent conductivity of the electrically-conductive polymer and the electrically-conductive polymer to binder weight ratio. A preferred range of dry coverage for the electrically-conductive substituted or unsubstituted thiophene-containing polymer component of the polythiophene/polyanion compositions is from about 0.5 mg/m.sup.2 to about 3.5 g/m.sup.2, this dry coverage should provide the desired electrical resistivity values while minimizing the impact of the electrically-conductive polymer on the color and optical properties of the article of the invention.

In addition to the electrically-conductive agent(s) and polymeric binder, the electrically-conductive materials of the invention may include crosslinking agents, organic polar solvents such as N-methyl pyrrolidone, ethylene or diethylene glycol, and the like; coating aids and surfactants, dispersing aids, coalescing aids, biocides, matte particles, dyes, pigments, plasticizer, adhesion promoting agents, particularly those comprising silane and/or epoxy silane, waxes, and other lubricants. A common level of coating aid in the conductive coating formula, e.g., is 0.01 to 0.3 weight % active coating aid based on the total solution weight. These coating aids are typically either anionic or nonionic and can be chosen from many that are applied for aqueous coating. The various ingredients of the coating solution may benefit from pH adjustment prior to mixing, to insure compatibility. Commonly used agents for pH adjustment are ammonium hydroxide, sodium hydroxide, potassium hydroxide, tetraethyl amine, sulfuric acid, acetic acid, etc.

The electrically-conductive materials of the invention may be applied from either aqueous or organic solvent coating formulations using any of the known coating techniques such as roller coating, gravure coating, air knife coating, rod coating, ink jet coating, electrostatic coating, slide hopper coating, extrusion coating, blade coating, curtain coating, slide coating, and the like. After coating, the layers are generally dried by simple evaporation, which can be accelerated by known techniques such as convection heating. Known coating and drying methods are described in further detail in Research Disclosure No. 308119, Published December 1989, pages 1007 to 1008. A preferred method for the coating of the electrically conductive materials into the conduits is roll coating of the sheet containing the conduits followed by removal of the conductive material located at the peaks of the conduits by a scraping blade or reverse roll contacting the peaks of the conduits.

A preferred method for the application of two or more layers is curtain coating. Curtain coating allows for several layers to be situated adjacent each other in a coating die before application to the substrate. Subsequent doctoring of the extra materials applied to the top most surface of the conduits allows the desired materials to be applied substantially to the conduits. Curtain coating allows for the application of the tow or more layers to occur in one coating pass thus reducing manufacturing cost.

In a preferred embodiment of the invention, the conductive material comprises a gelatin binder and a metallic salt. The gelatin binder has been shown to provide high visible light transparency, has excellent adhesion to the polymer conduits and contains moisture to aid in building a salt bridge between the particles of metallic salt. Examples of preferred metallic salts include sodium chloride, potassium iodide, calcium chloride, potassium bromide, sodium iodide, magnesium chloride, silver chloride and silver iodide. One interesting aspect of this particular embodiment is the humidity sensitivity of the gelatin. As ambient relative humidity moves below 50% the moisture content of the gelatin lowers and thus the resistivity of the conductive conduit increases creating a conductive circuit that is sensitivity to humidity. This particular embodiment would be useful as a humidity sensor that would control a system to add moisture to air as the humidity drops.

The desired resistivity of the conductive material is less than 5000 ohm meter. The preferred resistivity of the conductive materials is less than 1000 ohm meter, more preferred less than 600 ohm meter and most preferred between 0.01 and 300 ohm meter. In terms of SER of the conductive layer inside the conduit, the desired value is less than 5000 ohm/square, preferably less than 1000 ohm/square, more preferably less than 600 ohm/square and most preferably less than 300 ohm/square. Because the conductive materials of the invention tend to have some level of coloration and thus transmitted light density, the lower levels of preferred resistivity will generally increase the density and thus lower the light transmission. For example the transmission difference between 1000 ohm meters and 100 ohm meters for polythiophene is approximately 5%. Higher levels of preferred resistivity are preferred for high transparency requirements or for low cost liquid crystal display applications were resistivity is not a primary concern for changing the orientation of the cholesteric liquid crystal.

This invention is significantly advantaged over prior art patterned sheet in that the plurality of polymer conduits are integral to the polymer sheet. Integral polymer conduits tend to have the same materials composition as the sheet and there is no well defined boundary as one would expect when examining a coated structure. An integral conduit is advantaged over ultra violet coated and cured channels in that the conduits are integral, that is part of the polymer sheet rather than being applied to a polymer sheet which creates unwanted interface issues such as de-lamination, cracking due to coefficient of thermal expansion differences between the channel materials and the sheet materials. Because the conductive materials do have some low level of resistivity, the energy lost will be transformed into heat energy subjecting the article of the invention to changes in temperature, compounded by extreme ambient changes in temperature (−20 degrees Celsius to 100 degrees Celsius) that can be expected. Integral conduits have the same thermal expansion coefficients and thus do not suffer from prior art interface issues, do not suffer from multiple optical surfaces which create unwanted Fresnel reflections and can be produced with high levels of precision.

The conductive materials contained in the conduits of the invention are preferably protected with an overcoat material. By protecting the conductive material in the conduit, scratching and de-lamination of the conductive material in the conduit is avoided to produce a rugged conductive sheet. Further, by protecting the conductive material in the conduit, a secondary coating surface, adjacent to the protective layer can be utilized for coatings or printing. Examples of coatings or printing include imaging layers, printed membrane circuit designs, coatings of cholesteric liquid crystal materials, and microlens arrays to manage the output of the transmitted light.

The protective overcoat layer preferably has a pencil hardness of greater than 2H. A pencil hardness greater than 2H resists many of the scratching forces caused during device assembly or actual use. Scratching of the overcoat layer will cause unwanted disruptions to the transmitted light and thus will reduce the optical utility of the invention. The protective overcoat preferably has a surface roughness less than 0.18 micrometers. Surface roughness greater than 0.20 micrometers has been shown to diffuse transmitted light and reduce the backlight intensity of membrane switches for example. Additionally, surface roughness less than 0.18 provides an excellent surface for auxiliary coatings or printing.

The protective overcoat preferably has a resistivity greater than 5000 ohm meters. A resistivity greater than 5000 ohm meters provides sufficient electrical current flow resistance to prevent shorts in a circuit, current drain or unwanted electrical fields. The protective overcoat preferably has a surface energy less than 40 dynes/cm$^2$. By providing a surface energy less than 40 dynes/cm$^2$, water and other aqueous solvents which would change the resistivity of the conductive material form beads on the surface of the overcoat and can easily be removed.

The protective overcoat layer may consist of suitable material that protects the image from environmental solvents, resists scratching, and does not interfere with the light transmission quality. The protective overcoat layer is preferably applied to the conducive material in either a uniform coating or a pattern wise coating. In a preferred embodiment of the invention the protective overcoat is applied in the presence of an electric field and fused to the topmost layer causing the transparent polymer particles to form a continuous polymeric layer is preferred. An electrophotographic toner applied polymer is preferred, as it is an effective way to provide a thin layer.

In another embodiment, the protective overcoat layer is coatable from aqueous solution and forms a continuous, water-impermeable protective layer in a post-process fusing step. The protective overcoat layer is preferably formed by coating polymer beads or particles of 0.1 to 50 µm in average size together with a polymer latex binder on the emulsion side of a sensitized photographic product. Optionally, a small amount of water-soluble coating aids (viscosifiers, surfactants) can be included in the layer, as long as they leach out of the coating during processing. After coating the sheet is treated in such a way as to cause fusing and coalescence of the coated polymer beads, by heat and/or pressure (fusing), solvent treatment, or other means so as to form the desired continuous, water impermeable protective layer.

Examples of suitable polymers from which the polymer particles used in protective overcoat layer can be selected include poly(vinyl chloride), poly(vinylidene chloride), poly (vinyl chloride-co-vinylidene chloride), chlorinated polypropylene, poly(vinyl chloride-co-vinyl acetate), poly (vinyl chloride-co-vinyl acetate-co-maleic anhydride), ethyl cellulose, nitrocellulose, poly(acrylic acid) esters, linseed oil-modified alkyd resins, rosin-modified alkyd resins, phenol-modified alkyd resins, phenolic resins, polyesters, poly (vinyl butyral), polyisocyanate resins, polyurethanes, poly (vinyl acetate), polyamides, chroman resins, dammar gum, ketone resins, maleic acid resins, vinyl polymers, such as polystyrene and polyvinyltoluene or copolymer of vinyl polymers with methacrylates or acrylates, poly(tetrafluoro-ethylene-hexafluoropropylene), low-molecular weight polyethylene, phenol-modified pentaerythritol esters, poly(styrene-co-indene-co-acrylonitrile), poly(styrene-co-indene), poly(styrene-co-acrylonitrile), poly(styrene-co-butadiene), poly(stearyl methacrylate) blended with poly(methyl methacrylate), copolymers with siloxanes and polyalkenes. These polymers can be used either alone or in combination. In a preferred embodiment of the invention, the polymer comprises a polyester or poly(styrene-co-butyl acrylate). Preferred polyesters are based on ethoxylated and/or propoxylated bisphenol A and one or more of terephthalic acid, dodecenylsuccinic acid and fumaric acid as they form an acceptable protective overcoat layer that generally survives the rigors of a packaging label.

To increase the abrasion resistance of the protective overcoat layer, polymers which are cross-linked or branched can be used. For example, poly(styrene-co-indene-co-divinylbenzene), poly(styrene-co-acrylonitrile-co-divinylbenzene), or poly(styrene-co-butadiene-co-divinylbenzene) can be used.

The polymer particles for the protective overcoat layer should be transparent, and are preferably colorless. But it is specifically contemplated that the polymer particle can have some color for the purposes of color correction, or for special effects. Thus, there can be incorporated into the polymer particle dye which will impart color. In addition, additives can be incorporated into the polymer particle which will give to the overcoat desired properties. For example, a UV absorber can be incorporated into the polymer particle to make the overcoat UV absorptive, thus protecting the sheet from UV induced fading or blue tint can be incorporated into the polymer particle to offset the native yellowness of the gelatin used in the gelatin salt conductive material.

In addition to the polymer particles which form the protective overcoat layer, there can be combined with the polymer composition other particles which will modify the surface characteristics of the element. Such particle are solid and nonfusible at the conditions under which the polymer particles are fused, and include inorganic particles, like silica, and organic particles, like methylmethacrylate beads, which will not melt during the fusing step and which will impart surface roughness to the overcoat.

The surface characteristics of the protective overcoat layer are in large part dependent upon the physical characteristics of the polymer which forms the toner and the presence or absence of solid, nonfusible particles. However, the surface characteristics of the overcoat also can be modified by the conditions under which the surface is fused. For example, the surface characteristics of the fusing member that is used to fuse the toner to form the continuous overcoat layer can be selected to impart a desired degree of smoothness, texture or pattern to the surface of the element. Thus, a highly smooth fusing member will give a glossy surface to the imaged element, a textured fusing member will give a matte or otherwise textured surface to the element, a patterned fusing member will apply a pattern to the surface of the article.

Suitable examples of the polymer latex binder include a latex copolymer of butyl acrylate, 2-acrylamido-2-methyl-propanesulfonate, and acetoacetoxyethylmethacrylate. Other latex polymers which are useful include polymers having a 20 to 10,000 nm diameter and a Tg of less than 60° C. suspended in water as a colloidal suspension.

Examples of suitable coating aids for the protective overcoat layer include any water soluble polymer or other material that imparts appreciable viscosity to the coating suspension, such as high MW polysaccharide derivatives (e.g. xanthan gum, guar gum, gum acacia, Keltrol (an anionic polysaccharide supplied by Merck and Co., Inc.) high MW polyvinyl alcohol, carboxymethylcellulose, hydroxyethylcellulose, polyacrylic acid and its salts, polyacrylamide, etc). Surfactants include any surface active material that will lower the surface tension of the coating preparation sufficiently to prevent edge-withdrawal, repellencies, and other coating defects. These include alkyloxy- or alkylphenoxypolyether or polyglycidol derivatives and their sulfates, such as nonylphenoxypoly(glycidol) available from Olin Matheson Corporation or sodium octylphenoxy-poly(ethyleneoxide) sulfate, organic sulfates or sulfonates, such as sodium dodecyl sulfate, sodium dodecyl sulfonate, sodium bis(2-ethylhexyl)sulfosuccinate (Aerosol OT), and alkylcarboxylate salts such as sodium decanoate.

In another embodiment, the application of an ultraviolet polymerizable monomers and oligomers to the conductive materials is preferred. UV cure polymers are preferred, as they can easily be applied to the conductive material in both a uniform coating or a patterned coating. Preferred UV cure polymers include aliphatic urethane, allyl methacrylate, ethylene glycol dimethacrylate, polyisocyanate and hydroxyethyl methacrylate. A preferred photoinitiator is benzil dimethyl ketal. The preferred intensity of radiation is between 0.1 and 1.5 milliwatt/cm$^2$. Below 0.05, insufficient cross-linking occurs yielding a protective layer that does not offer sufficient protection for the protection of the conductive materials.

In another embodiment of the invention, the application of a pre-formed polymer layer to the outermost surface of the conduits form an protective overcoat layer is most preferred. Application of a pre-formed sheet is preferred because pre-formed sheets are tough and durable easily withstanding the environmental solvents and handling forces. Application of the pre-formed polymer sheet is preferable carried out though lamination after image development. An adhesive is applied to either the photographic label or the pre-formed polymer sheet prior to a pressure nip that adheres the two surfaces and eliminates any trapped air that would degrade the quality of the transmitted light.

The pre-formed sheet preferably is an oriented polymer because of the strength and toughness developed in the orientation process. Preferred polymers for the flexible substrate include polyolefins, polyester and nylon. Preferred polyolefins include polypropylene, polyethylene, polymethylpentene, polystyrene, polybutylene, and mixtures thereof. Polyolefin copolymers, including copolymers of propylene and ethylene such as hexene, butene, and octene are also useful. Polypropylene is most preferred, as it is low in cost and has desirable strength and toughness properties required for a pressure sensitive label.

In another embodiment, the application of a synthetic latex to the conductive materials to form a protective overcoat layer is preferred. A coating of synthetic latex has been shown to provide an acceptable protective overcoat layer and can be coated in an aqueous solution eliminating exposure to solvents. The coating of latex has been shown to provide an acceptable protective overcoat layer for conductive circuits. Preferred synthetic latexes for the protective overcoat layer are made by emulsion polymerization techniques from styrene butadiene copolymer, acrylate resins, and polyvinyl acetate. The preferred particles size for the synthetic latex ranges from 0.05 to 0.15 µm. The synthetic latex is applied to the outermost layer of the silver halide imaging layers by known coating methods that include rod coating, roll coating and hopper coating. The synthetic latexes must be dried after application and must dry transparent so as not to interfere with the quality of the transmitted light energy.

In a preferred embodiment, the conductive material comprises a pigment or dye. Pigments or dye provide coloration to the conductive material creating contrast difference between the insulating areas of the article and the conductive materials. Increasing the transmitted light contrast with a white pigment or carbon black provides allows for a higher contrast image or the ability to lower the illuminant output.

In another embodiment of the invention, the conductive materials or auxiliary layers contain a colored dye or pigment. A colored dye or pigment is preferred because it can add coloration to white transmitted light, provides a means to visibly locate the conduits and provides colored in plane wave guiding of white or colored light. While using pigments it is desirable to reduce the particle size of the pigment to reduce unwanted scattering. Suitable pigments used in this invention can be any inorganic or organic, colored materials that are practically insoluble in the medium in which they are incorporated. The preferred pigments are organic, and are those described in *Industrial Organic Pigments: Production, Properties, Applications* by W. Herbst and K. Hunger, 1993, Wiley Publishers. These include: azo pigments such as monoazo yellow and orange, diazo, naphthol, naphthol reds, azo lakes, benzimidazolone, disazo condensation, metal complex, isoindolinone and isoindoline; polycyclic pigments such as phthalocyanine, quinacridone, perylene, perinone, diketopyrrolo pyrrole and thioindigo; and anthrquinone pigments such as anthrapyrimidine, flavanthrone, pyranthrone, anthanthrone, dioxazine, triarylcarbodium and quinophthalone.

An aqueous dispersion of the pigments is preferred because the preferred pigments are insoluble in most, if not all, organic solvents, and therefore a high quality dispersion is not likely in a solvent system. In fact, the only solvent that will dissolve preferred pigments PR-122 and PB-15 is concentrated sulfuric acid, which is not an organic solvent. Preferred pigments of the invention are by nature, insoluble, crystalline solids, which is the most thermodynamically stable form that they can assume. In an oil and water dispersion, they would be in the form of an amorphous solid, which is thermodynamically unstable. Therefore, one would have to worry about the pigment eventually converting to the crystalline form with age. We might as well start with a crystalline solid and not worry about preventing the phase transition. Another reason to avoid solvent pigment dispersions is that the high boiling solvent is not removed with evaporation, and it could cause unwanted interactions in the coating melt such as ripening of DOH dispersion particles, or equilibration with other layers, if it was used in the coating. The use of solid particle dispersion avoids organic solvents altogether.

In the preferred embodiment, the colorant is dispersed in the binder in the form of a solid particle dispersion. Such dispersions are formed by first mixing the colorant with an aqueous solution containing a water-soluble or water-dispersible surfactant or polymer to form a coarse aqueous premix, and adding the premix to a mill. The amount of water-soluble or water-dispersible surfactant or polymer can vary over a wide range, but is generally in the range of 0.01% to 100% by weight of polymer, preferably about 0.3% to about 60%, and more preferably 0.5% to 50%, the percentages being by weight of polymer, based on the weight of the colorant useful in imaging.

The mill can be for example, a ball mill, media mill, attritor mill, vibratory mill or the like. The mill is charged with the appropriate milling media such as, for example, beads of silica, silicon nitride, sand, zirconium oxide, yttria-stabilized zirconium oxide, alumina, titanium, glass, polystyrene, etc. The bead sizes typically range from 0.25 to 3.0 mm in diameter, but smaller media can be used if desired. The premix is milled until the desired particle size range is reached.

The solid colorant particles are subjected to repeated collisions with the milling media, resulting in crystal fracture, de-agglomeration, and consequent particle size reduction. The solid particle dispersions of the colorant should have a final average particle size of less than 1 micrometers, preferably less than 0.1 micrometers, and most preferably between 0.01 and 0.1 micrometers. Most preferably, the solid colorant particles are of sub-micrometer average size. Solid particle size between 0.01 and 0.1 provides the best pigment utilization and had a reduction in unwanted light absorption compared to pigments with a particle size greater than 1.2 micrometers.

Surfactants, polymers, and other additional conventional addenda may also be used in the dispersing process described herein in accordance with prior art solid particle dispersing procedures. Such surfactants, polymers and other addenda are disclosed in U.S. Pat. Nos. 5,468,598, 5,300,394, 5,278,037, 4,006,025, 4,924,916, 4,294,917, 4,940,654, 4,950,586, 4,927,744, 5,279,931, 5,158,863, 5,135,844, 5,091,296, 5,089,380, 5,103,640, 4,990,431, 4,970,139, 5,256,527, 5,089,380, 5,103,640, 4,990,431, 4,970,139, 5,256,527, 5,015,564, 5,008,179, 4,957,857, and 2,870,012, British Patent specifications Nos. 1,570,362 and 1,131,179 referenced above, the disclosures of which are hereby incorporated by reference, in the dispersing process of the colorants.

Additional surfactants or other water-soluble polymers may be added after formation of the colorant dispersion, before or after subsequent addition of the colorant dispersion to an aqueous coating medium for coating onto an imaging element support. The aqueous medium preferably contains other compounds such as stabilizers and dispersants, for example, additional anionic, nonionic, zwitterionic, or cationic surfactants, and water-soluble binders such as gelatin as is well known in the imaging art. The aqueous coating medium may further contain other dispersions or emulsions of compounds useful in imaging.

The article of the invention preferably has a light transmission greater than 75% or more preferably a light transmission greater than 90%. By providing high light transmission, the article of the invention can be utilized as a display such as a membrane switch or a radio frequency antenna without the conductive materials obstructing the visible light.

The conduits of the invention preferably comprise thermoplastic polymers. Thermoplastic polymers are preferred as they are generally lower in cost compared to prior art glass, have excellent optical properties and can be efficiently formed into sheets utilizing an extrusion roll molding process were melted polymer is cast against a patterned precision roll forming integral conduits. Preferred polymers for the formation of the complex lenses include polyolefins, polyesters, polyamides, polycarbonates, cellulosic esters, polystyrene, polyvinyl resins, polysulfonamides, polyethers, polyimides, polyvinylidene fluoride, polyurethanes, polyphenylenesulfides, polytetrafluoroethylene, polyacetals, polylatic acid, liquid crystal polymers, cyclo-olefins, polysulfonates, polyester ionomers, and polyolefin ionomers. Copolymers and/or mixtures of these polymers to improve mechanical or optical properties can be used. Preferred polyamides for the transparent complex lenses include nylon 6, nylon 66, and mixtures thereof. Copolymers of polyamides are also suitable continuous phase polymers. An example of a useful polycarbonate is bisphenol-A polycarbonate. Cellulosic esters suitable for use as the continuous phase polymer of the complex lenses include cellulose nitrate, cellulose triacetate, cellulose diacetate, cellulose acetate propionate, cellulose acetate butyrate, and mixtures or copolymers thereof. Preferred polyvinyl resins include polyvinyl chloride, poly(vinyl acetal), and mixtures thereof. Copolymers of vinyl resins can also be utilized. Preferred polyesters for the complex lens of the invention include those produced from aromatic, aliphatic or cycloaliphatic dicarboxylic acids of 4-20 carbon atoms and aliphatic or alicyclic glycols having from 2-24 carbon atoms. Examples of suitable dicarboxylic acids include terephthalic, isophthalic, phthalic, naphthalene dicarboxylic acid, succinic, glutaric, adipic, azelaic, sebacic, fumaric, maleic, itaconic, 1,4-cyclohexanedicarboxylic, sodiosulfoisophthalic and mixtures thereof. Examples of suitable glycols include ethylene glycol, propylene glycol, butanediol, pentanediol, hexanediol, 1,4-cyclohexanedimethanol, diethylene glycol, other polyethylene glycols and mixtures thereof.

The depth of the conduits, measured from the surface of the top of the conduit on the outermost layer o the conductive sheet preferably has a depth of between 0.1 and 100 micrometers, more preferably between 0.1 and 10 micrometers. It has been found that the depth of the channels should roughly equal the thickness of the conductive material plus the thickness of the protective layer. Most contemplated combination of conductive material thickness added to overcoat layer thickness are between 0.10 and 100 micrometers and are optimized for electrical conductivity between 1 and 8 micrometers. The preferred thickness of the sheet is between 20 and 300 micrometers. Below 15 micrometers, the conduits are difficult to form and coat with the conductive materials. Above 300 micrometers, the additional thickness is not cost justified.

The roughness average of the top of said polymer conduits is between 0.25 and 2.5 micrometers. By providing a rough surface to the top conduit, a stand off layer is created for the lamination of an oriented polymer sheet. In another embodiment, the roughness average of the top of the polymer conduits is less than 0.20 micrometers. By providing a smooth conduit surface, auxialry coating can be added without creating light diffusion in transmission.

The surface roughness of the bottom of the conduits preferably is between 0.25 and 2.5 micrometers. By providing a bottom surface roughness in this range, the amount of surface area is increased compared to a smooth bottom surface which increases the amount of electrical conductivity. Further, by providing a rough bottom surface, the adhesion of the conductive material to the conduit polymer is improved thereby improving the reliability of the conductive conduit as disruption in the coating would result in resistivity greater than 5000 ohm meters. In another embodiment, the bottom surface in the conduit has a surface roughness less than 0.20 micrometers. By providing a smooth bottom surface, transmitted light is less likely to be diffused, improving the contrast of printed layers or imaged layers.

In another preferred embodiment of the invention, the polymer layer further comprises a pressure sensitive adhesive. A pressure sensitive adhesive allows the article of the invention to be positioned on other substrates or devices. An example is adhering the article of the invention to as glass substrate for use as a display device or adhering the article of the invention to a printed circuit board. The pressure sensitive comprises adhesives that are known in the art to be transparent and have a high bond strength. Examples include acrylic and urethane based pressure sensitive adhesive systems.

The plurality of conduits preferably have at least one intersection point. By providing at least one intersection point, the conductive conduits of the invention can power by a single power source such as a DC source, and an be terminated at some logical point such as an IC chip, resistor, capacitor, transistor or electrical ground. In another preferred embodiment of the invention, the plurality of conduits have at least one direction change relative to the conduit starting direction. A direction change of greater than 30 degrees allows the conductive conduits of the invention to be better utilized as connections for an electrical circuit. An example of a direction change greater than 30 degrees would be the electrical connections in a membrane switch. In a membrane switch, the conductive membrane, upon depression, completes an electrical circuit that communicates switch logic with an auxiliary device such as an IC chip. Conductive conduits that change direction are better able to be positioned around the membrane switch contact area often requiring several direction changes to accommodate the layout of the switch.

In order to improve the impact strength of the polymer conduits and improve the temperature resistance of the polymers conduits, nanocomposite addition to the polymer conduits is preferred. Nanocomposite materials have been shown to improve the thermal properties of conduit polymer and increase the mechanical modulus, thus, making them more suitable for polymer circuits and display devices.

"Nanocomposite" shall mean a composite material wherein at least one component comprises an inorganic phase, such as a smectite clay, with at least one dimension in the 0.1 to 100 nanometer range. "Plates" shall mean particles with two dimensions of the same size scale and is significantly greater than the third dimension. Here, length and width of the particle are of comparable size but orders of magnitude greater than the thickness of the particle.

"Layered material" shall mean an inorganic material such as a smectite clay that is in the form of a plurality of adjacent bound layers. "Platelets" shall mean individual layers of the layered material. "Intercalation" shall mean the insertion of one or more foreign molecules or parts of foreign molecules between platelets of the layered material, usually detected by X-ray diffraction technique, as illustrated in U.S. Pat. No. 5,891,611 (line 10, col. 5-line 23, col. 7).

"Intercalant" shall mean the aforesaid foreign molecule inserted between platelets of the aforesaid layered material. "Exfoliation" or "de-lamination" shall mean separation of individual platelets in to a disordered structure without any stacking order. "Intercalated" shall refer to layered material that has at least partially undergone intercalation and/or exfoliation. "Organoclay" shall mean clay material modified by organic molecules.

The layered materials for this invention can comprise any inorganic phase desirably comprising layered materials in the shape of plates with significantly high aspect ratio. However, other shapes with high aspect ratio will also be advantageous, as per the invention. The layered materials preferred for this invention include phyllosilicates, e.g., montmorillonite, particularly sodium montmorillonite, magnesium montmorillonite, and/or calcium montmorillonite, nontronite, beidellite, volkonskoite, hectorite, saponite, sauconite, sobockite, stevensite, svinfordite, vermiculite, magadiite, kenyaite, talc, mica, kaolinite, and mixtures thereof. Other useful layered materials include illite, mixed layered illite/smectite minerals, such as ledikite and admixtures of illites with the clay minerals named above. Other useful layered materials, particularly useful with anionic matrix polymers, are the layered double hydroxides or hydrotalcites, such as $Mg_6Al_{3.4}(OH)_{18.8}(CO_3)_{1.7}H_2O$, which have positively charged layers and exchangeable anions in the interlayer spaces. Other layered materials having little or no charge on the layers may be useful provided they can be intercalated with swelling agents, which expand their interlayer spacing. Such materials include chlorides such as $FeCl_3$, $FeOCl$, chalcogenides, such as $TiS_2$, $MoS_2$, and $MoS_3$, cyanides such as $Ni(CN)_2$ and oxides such as $H_2Si_2O_5$, $V_6O_{13}$, $HTiNbO_5$, $Cr_{0.5}V_{0.5}S_2$, $V_2O_5$, Ag doped $V_2O_5$, $W_{0.2}V_{2.8}O7$, $Cr_3O_8$, $MoO_3(OH)_2$, $VOPO_4$-$2H_2O$, $CaPO_4CH_3$—$H_2O$, $MnHAsO_4$—$H_2O$, $Ag_6Mo_{10}O_{33}$ and the like. Preferred layered materials are swellable so that other agents, usually organic ions or molecules, can intercalate and/or exfoliate the layered material resulting in a desirable dispersion of the inorganic phase. These swellable layered materials include phyllosilicates of the 2:1 type, as defined in clay literature (vide, for example, "An introduction to clay colloid chemistry," by H. van Olphen, John Wiley & Sons Publishers). Typical phyllosilicates with ion exchange capacity of 50 to 300 milliequivalents per 100 grams are preferred. Preferred layered materials for the present invention include smectite clay such as montmorillonite, nontronite, beidellite, volkonskoite, hectorite, saponite, sauconite, sobockite, stevensite, svinfordite, halloysite, magadiite, kenyaite and vermiculite as well as layered double hydroxides or hydrotalcites. Most preferred smectite clays include montmorillonite, hectorite and hydrotalcites, because of commercial availability of these materials.

The aformentioned smectite clay can be natural or synthetic. This distinction can influence the particle size and/or the level of associated impurities. Typically, synthetic clays are smaller in lateral dimension, and therefore possess smaller aspect ratio. However, synthetic clays are purer and are of narrower size distribution, compared to natural clays and may not require any further purification or separation.

For this invention, the smectite clay particles should have a lateral dimension of between 0.01 μm and 5 μm, and preferably between 0.05 μm and 2 μm, and more preferably between 0.1 μm and 1 μm. The thickness or the vertical dimension of the clay particles can vary between 0.5 nm and 10 nm, and preferably between 1 nm and 5 nm. The aspect ratio, which is the ratio of the largest and smallest dimension of the clay particles should be between 10:1 and 1000:1 for this invention. The aforementioned limits regarding the size and shape of the particles are to ensure adequate improvements in some properties of the nanocomposites without deleteriously affecting others. For example, a large lateral dimension may result in an increase in the aspect ratio, a desirable criterion for improvement in mechanical and barrier properties. However, very large particles can cause optical defects due to deleterious light scattering, and can be abrasive to processing, conveyance and finishing equipment as well as to other components.

The concentration of smectite clay in the optical component of the invention can vary as per need; however, it is preferred to be <10% by weight of the binder. Significantly higher amounts of clay can impair physical properties of the optical component by rendering it brittle, as well as difficult to process. On the other hand, too low a concentration of clay may fail to achieve the desired optical effect. It is preferred that the clay concentration be maintained between 1 and 10% and more preferred to be between 1.5 and 5% for optimum results.

The smectite clay materials, generally require treatment by one or more intercalants to provide the required interlayer swelling and/or compatibility with the matrix polymer. The resulting interlayer spacing is critical to the performance of the intercalated layered material in the practice of this invention. As used herein the "inter-layer spacing" refers to the distance between the faces of the layers as they are assembled in the intercalated material before any delamination (or exfoliation) takes place. The preferred intercalants include organic and polymeric materials, particularly block copolymers as disclosed in dockets 82056; 82,857; 82858 and 82,859; incorporated herein by reference. Examples of such intercalants include ethoxylated alcohols, polyether block polyamide, poly(ethylene oxide-b-caprolactone) and the like. These preferred intercalants can be incorporated in natural or synthetic clay. These preferred intercalants can also be incorporated in organoclays, which have already been modified by organic molecule(s).

In order to provide a electrically or optically conductive sheet in the plane of the sheet in which some or all of the electrically or optically conductive conduits are connected, an article comprising a polymer layer containing a plurality of integral polymer conduits containing a conductive material in which two or more conduits terminate is preferred. Termination of the conduits is preferred in that greater electrical or optical utility can be achieved by utilizing the conductive pathways to connect useful electrical or optical components in a light or electrical circuit. Connection of the conduits is preferred because the connection occurs in the bulk of the sheet protecting the connecting materials, can be patterned roll to roll and both optical and electrical utilities can exist in the same sheet providing a dual function material.

The article of the invention may also be used in conjunction with a light diffuser, for example a bulk diffuser, a lenticular layer, a beaded layer, a surface diffuser, a holographic diffuser, a micro-structured diffuser, another lens array, or various combinations thereof. A diffuser film disperses, or diffuses, the light, thus destroying any diffraction pattern that may arise from the addition of an ordered periodic lens array.

The article of the present invention may be used in combination with a film or sheet made of a transparent polymer. Examples of such polymer are polyesters such as polycarbonate, polyethylene terephthalate, polybutylene terephthalate and polyethylene naphthalate, acrylic polymers such as polymethyl methacrylate, and polyethylene, polypropylene, polystyrene, polyvinyl chloride, polyether sulfone, polysulfone, polyacrylate and triacetyl cellulose. The transparent polymeric film of the invention can also include, in another aspect, one or more optical coatings to improve optical transmission through one or more conduits. It is often desirable to coat a diffuser with a layer of an anti-reflective (AR) coating in order to raise the efficiency of the article.

The article of the present invention may be incorporated with e.g. an additive or a lubricant such as silica for improving the surface-slipperiness of the film within a range not to deteriorate the optical characteristics to vary the light-scattering property with an incident angle. Examples of such additive are organic solvents such as xylene, alcohols or ketones, fine particles of an acrylic resin, silicone resin or A metal oxide or a filler.

The article of the present invention usually has optical anisotropy. The polymer sheet containing thermoplastic conduits are generally optically anisotropic materials exhibiting optical anisotropy having an optic axis in the drawing direction. The optical anisotropy is expressed by the product of the film thickness d and the birefringence Δn which is a difference between the refractive index in the slow optic axis direction and the refractive index in the fast optic axis direction in the plane of the film, i.e. Δn*d (retardation). The orientation direction coincides with the drawing axis in the film of the present invention. The drawing axis is the direction of the slow optic axis in the case of a thermoplastic polymer having a positive intrinsic birefringence and is the direction of the fast optic axis for a thermoplastic polymer having a negative intrinsic birefringence. There is no definite requirement for the necessary level of the value of Δn.*d since the level depends upon the application of the film.

In the manufacturing process for this invention, preferred conduit polymers are melt extruded from a slit die. In general, a T die or a coat hanger die are preferably used. The process involves extruding the polymer or polymer blend through a slit die and rapidly quenching the extruded web upon a chilled casting drum with the preferred conduit geometry so that the conduit polymer component of the transparent sheet are quenched below their glass solidification temperature and retain the shape of the desired conduits.

A method of fabricating the polymer conduits was developed. The preferred approach comprises the steps of providing a positive master extrusion roll having a plurality of conduits. The sheet is replicated from the master extrusion roller by casting the desired molten polymeric material to the face of the extrusion roll, cooling the desired polymer below the Tg of the polymer and then striping the polymer sheet containing the conduits from the extrusion roll. The patterned roll is created by machine the negative of the pattern into the roller utilizing precision machine techniques such as ion beam milling r diamond turning. The negative of the desired conduit pattern may also be machined into a thin metallic sheet and then wrapped around a roller. The conduits of the invention may also be created by hot embossing, UV cure polymers, vacuum forming or injection molding.

The invention may be used in conjunction with any liquid crystal display devices, typical arrangements of which are described in the following. Liquid crystals (LC) are widely used for electronic displays. In these display systems, an LC layer is situated between a polarizer layer and an analyzer layer and has a director exhibiting an azimuthal twist through the layer with respect to the normal axis. The analyzer is oriented such that its absorbing axis is perpendicular to that of the polarizer. Incident light polarized by the polarizer passes through a liquid crystal cell is affected by the molecular orientation in the liquid crystal, which can be altered by the application of a voltage across the cell. By employing this principle, the transmission of light from an external source, including ambient light, can be controlled. The energy required to achieve this control is generally much less than that required for the luminescent materials used in other display types such as cathode ray tubes. Accordingly, LC technology is used for a number of applications, including but not limited to digital watches, calculators, portable computers, electronic games for which light weight, low power consumption and long operating life are important features.

Active-matrix liquid crystal displays (LCDs) use thin film transistors (TFTs) as a switching device for driving each liquid crystal pixel. These LCDs can display higher-definition images without cross talk because the individual liquid crystal pixels can be selectively driven. Optical mode interference (OMI) displays are liquid crystal displays, which are "normally white," that is, light is transmitted through the display layers in the off state. Operational mode of LCD using the twisted nematic liquid crystal is roughly divided into a birefringence mode and an optical rotatory mode. "Film-compensated super-twisted nematic" (FSTN) LCDs are normally black, that is, light transmission is inhibited in the off state when no voltage is applied. OMI displays reportedly have faster response times and a broader operational temperature range.

Ordinary light from an incandescent bulb or from the sun is randomly polarized, that is, it includes waves that are oriented in all possible directions. A polarizer is a dichroic material that functions to convert a randomly polarized ("unpolarized") beam of light into a polarized one by selective removal of one of the two perpendicular plane-polarized components from the incident light beam. Linear polarizers are a key component of liquid-crystal display (LCD) devices.

There are several types of high dichroic ratio polarizers possessing sufficient optical performance for use in LCD devices. These polarizers are made of thin sheets of materials which transmit one polarization component and absorb the other mutually orthogonal component (this effect is known as dichroism). The most commonly used plastic sheet polarizers are composed of a thin, uniaxially-stretched polyvinyl alcohol (PVA) film which aligns the PVA polymer chains in a more-or-less parallel fashion. The aligned PVA is then doped with iodine molecules or a combination of colored dichroic dyes (see, for example, EP 0 182 632 A2, Sumitomo Chemical Company, Limited) which adsorb to and become uniaxially oriented by the PVA to produce a highly anisotropic matrix with a neutral gray coloration. To mechanically support the fragile PVA film it is then laminated on both sides with stiff layers of triacetyl cellulose (TAC), or similar support.

Contrast, color reproduction, and stable gray scale intensities are important quality attributes for electronic displays, which employ liquid crystal technology. The primary factor limiting the contrast of a liquid crystal display is the propensity for light to "leak" through liquid crystal elements or cell, which are in the dark or "black" pixel state. Furthermore, the leakage and hence contrast of a liquid crystal display are also dependent on the angle from which the display screen is viewed. Typically the optimum contrast is observed only within a narrow viewing angle centered about the normal incidence to the display and falls off rapidly as the viewing angle is increased. In color displays, the leakage problem not only degrades the contrast but also causes color or hue shifts with an associated degradation of color reproduction. In addition to black-state light leakage, the narrow viewing angle problem in typical twisted nematic liquid crystal displays is exacerbated by a shift in the brightness-voltage curve as a function of viewing angle because of the optical anisotropy of the liquid crystal material.

The article of the invention was measured for transmission with the Hitachi U4001 UV/Vis/NIR spectrophotometer equipped with an integrating sphere. The total transmittance spectra were measured by placing the samples at the beam port with the front surface with conduits towards the integrating sphere. A calibrated 99% diffusely reflecting standard (NIST-traceable) was placed at the normal sample port. The diffuse transmittance spectra were measured in like manner, but with the 99% tile removed. The diffuse reflectance spectra were measured by placing the samples at the sample port with the coated side towards the integrating sphere. In order to exclude reflection from a sample backing, nothing was placed behind the sample. All spectra were acquired between 350 and 800 nm. As the diffuse reflectance results are quoted with respect to the 99% tile, the values are not absolute, but would need to be corrected by the calibration report of the 99% tile.

Percentage total transmitted light refers to percent of light that is transmitted though the sample at all angles. Diffuse transmittance is defined as the percent of light passing though the sample excluding a 2.5 degree angle from the incident light angle. The diffuse light transmission is the percent of light that is passed through the sample by diffuse transmittance. Diffuse reflectance is defined as the percent of light reflected by the sample. The percentages quoted in the examples were measured at 500 nm. These values may not add up to 100% due to absorbencies of the sample or slight variations in the sample measured.

Embodiments of the invention may provide not only improved light diffusion and transmission but also a diffusion film of reduced thickness, and that has reduced light scattering tendencies.

The entire contents of the patents and other publications referred to in this specification are incorporated herein by reference.

The invention has been described in detail with particular reference to certain preferred embodiments thereof, but it will be understood that variations and modifications can be effected within the spirit and scope of the invention.

EXAMPLES

In this example, polycarbonate V shaped conduits were formed integral to a polycarbonate 100 micrometer sheet. A conductive, transparent form of two layers of polythiophene separated by a polyvinyl alcohol layer was applied into the V shaped conduits creating a transparent conductive sheet. This invention will demonstrate the conductive and transmissive properties of the polymer sheet containing the two layers of the conductive, transparent polymer.

The V shaped conduits were made by casting melted polycarbonate against a heated roller containing the negative of the V groove pattern. The V-groove patterned roller was manufactured by precision machining, utilizing a wire EDM cutting tool, the negative of the V groove pattern into the surface of a smooth steel roller.

The V groove patterned roller was used to create the integral polycarbonate conduits by extrusion casting a polycarbonate polymer from a coat hanger slot die comprising substantially 98.0% 68 melt index CD grade polycarbonate (Bayer Chemical), 1.5% antioxidant and 0.5% release agent on to the heated V grove patterned roller (120 degrees C.), cooling the polycarbonate below the Tg of the polycarbonate and striping the polycarbonate web containing the V grove shaped conduits from the heated roller. The thickness of the polymer sheet containing the V-grooves was 100 micrometers. The V grooves were 10 micrometers deep with a 1 micrometer flat at the bottom of the V groove with a pitch of 200 micrometers. There were 20 conduits counted in a direction perpendicular to the primary direction of the conduits. All 20 conduits were roughly equidistant from each other along the 30 cm length of the conduits. The structure of the cast coated light diffusion sheets of the invention was as follows, ---
Formed integral polycarbonate V grooves
Transparent polycarbonate base
---

After formation of the polycarbonate sheet containing the V groove shaped conduits, the sheet was subjected to corona discharge treatment and coated with a conductive coating composition by hopper coating. The conductive coating composition comprised of Baytron P, a commercially available poly (3,4 ethylenedioxythiophene) poly(styrenesulfonate) aqueous dispersion, supplied by Bayer corporation, and other addenda including surfactant, and organic polar solvents. Immediately upon coating, the polycarbonate sheet was carefully wiped off with a wet piece of lint-free cloth so that only the grooves retained the coating composition, which was allowed to dry there. The first layer of the Baytron P was then coated with an aqueous transparent version of polyvinyl alcohol and the polycarbonate sheet was carefully wiped as to eliminate the PVA from the upper most surface of the polycarbonate conduits. A second layer of the Baytron P was then applied in the same manor as the first on the polyvinyl alcohol. The nominal dry coverage of the transparent, electronically conductive poly (3,4 ethylenedioxythiophene) poly(styrenesulfonate) within each layer of the groove was estimated to be 0.33 g/M². The dry coverage of the transparent polyvinyl alcohol was estimated to be 1.47 grams/M².

The cross section of the sheet of the example showing the alternating layers of conductive polymer separated by an insulating layer was as follows, ---
Baytron P
PVA
Baytron P
Polycarbonate sheet
---

The resistivity of the conductive conduits was measured using a FLUKE model 300 multimeter which is a two probe contact method of measuring resistivity. Each conductive conduit was measured for resisitivity and the average and range for each of 20 conductive conduits was determined. The resistivity of the top most layer of Baytron P by surface contact with the measurement probes. The resistivity of the bottom most layer of Baytron P was measured by removing both the first layer of Baytron P and PVA from the conduits at each end of the sheet with a precision scraper blade. The average SER for the first conductive transparent layer was 790 ohms/square with a range of 91 ohms/square. The average SER for the second conductive transparent layer was 823 ohms/square with a range of 84 ohms/square. The resistivity of the PVA layer was greater than 5,000 ohms/square.

The polycarbonate sheet containing the conductive, transparent V shaped conduits were measured for % light transmission, % diffuse light transmission, % specular light transmission and % diffuse reflectance and conductivity.

The conductive sheet was measured with the Hitachi U4001 UV/Vis/NIR spectrophotometer equipped with an integrating sphere. The total transmittance spectra were measured by placing the samples at the beam port with the front surface with complex lenses towards the integrating sphere. A calibrated 99% diffusely reflecting standard (NIST-traceable) was placed at the normal sample port. The diffuse transmittance spectra were measured in like manner, but with the 99% tile removed. The diffuse reflectance spectra were measured by placing the samples at the sample port with the coated side towards the integrating sphere. In order to exclude reflection from a sample backing, nothing was placed behind the sample. All spectra were acquired between 350 and 800 nm. As the diffuse reflectance results are quoted with respect to the 99% tile, the values are not absolute, but would need to be corrected by the calibration report of the 99% tile.

Percentage total transmitted light refers to percent of light that is transmitted through the sample at all angles. Diffuse transmittance is defined as the percent of light passing through the sample excluding a 2 degree angle from the incident light angle. The diffuse light transmission is the percent of light that is passed through the sample by diffuse transmittance. Diffuse reflectance is defined as the percent of light reflected by the sample. The percentages quoted in the examples were measured at 500 nm. These values may not add up to 100% due to absorbencies of the sample or slight variations in the sample measured. The total transmission was 87.7%, the diffuse transmission was 10.8%, the specular transmission was 80.5% and the diffuser reflection was 8.1%.

The data above clearly demonstrates both the electrical and optical utility of the invention. The conductive materials applied to the V shaped conduits having a resistivity of approximately 800 ohms/square provides excellent electrical conductivity while simultaneously providing an excellent light transmission of 87.7%. This allows the invention material to be particularly useful in electrical application that require both conductivity and transparency such as a membrane switch for an appliance or a security card containing a smart chip. The polycarbonate sheet and conduits were high in transmission because of the lack of crystallinity in the polycarbonate. Also, the V groove geometry of the conduits tended to wave guide the transmitted light away from the layers applied into the channels.

Further, the conduits of the invention provide protection to the delicate conductive polymer improving the reliability of the conductive channel by significantly reducing the disruption of the conductive pattern by scratching or abrasion. Additionally, the geometry of the conduits also allows for the addition of a protective layer further protecting the delicate conductive materials from abrasion or moisture.

The two electrically conducting layers of Baytron P did not electrically short because of the insulating PVA applied between the first and second layers allowing two conducting layers to occupy substantially the same space. One of the two conductive layers could be used for electrical current flow while the second could be used for electrical signals.

Flexible conductive materials applied in precision flexible conduits are particularly useful for electrical devices such as cell phones and liquid crystal displays that require light weight and durable components. The conductive conduits can be used to connect electrical components such as resistors or IC chips. Further, because the index of refraction of the multiple layers in the conduits can be altered, the invention can also wave guide light allowing for illuminated membrane switches utilizing perimeter light sources such as LED lights, laser light sources or CCFL light sources.

PARTS LIST

2. Base sheet
4. Transparent electrically conductive layer
6. Transparent electrically insulating layer
8. Transparent electrically conducting layer
10. Multi-layered transparent conductive conduit

What is claimed is:

1. An article comprising a polymer layer containing a plurality of integral polymer conduit channels wherein the conduit channels comprise trenches, furrows or grooves in the surface of the polymeric material, wherein the conduits, measured from the surface of the top of the conduit, have a depth of between 0.1 and 100 micrometers, and wherein the conduit channels contain at least two layers with at least one comprising a transparent electronically conductive polymeric material that is conductive in the plane of the sheet and the other serving a function beyond protection, the layers being overcoated in the channels with a protective overcoat.

2. The article of claim 1 wherein one of the at least two layers contains a liquid crystal material.

3. An article comprising a sheet including a polymer layer containing a plurality of integral polymer conduit channels wherein the conduit channels comprise trenches, furrows or grooves in the surface of the polymeric material, wherein the conduits, measured from the surface of the top of the conduit, have a depth of between 0.1 and 100 micrometers, and wherein the conduit channels contain at least two layers with at least one comprising a transparent polymeric electronically conductive material that is conductive in the plane of the sheet and the other serving a function beyond protection selected from conduction, insulation, dielectric capacitance, membrane diffusion, and adhesion.

4. An article comprising a sheet including a polymer layer containing a plurality of integral polymer conduit channels wherein the conduit channels comprise trenches, furrows or grooves in the surface of the polymeric material, wherein the conduits, measured from the surface of the top of the conduit, have a depth of between 0.1 and 100 micrometers, and wherein the conduit channels contain at least two layers with at least one comprising a transparent polymeric electronically conductive material that is conductive in the plane of the sheet to provide precision pathways for conducting of electricity from an origination point to a destination and the other serving a function beyond protection selected from conduction, insulation, dielectric capacitance, membrane diffusion, adhesion, and wave guiding in the plane of the sheet.

5. The article of claim 4 comprising two or more distinct conductive layers.

6. The article of claim 4 wherein said two or more conductive layers are separated by an insulating layer with a conductivity greater than 5,000 ohms/cm.

7. The article of claim 4 wherein said two or more layers have a conductivity difference of greater than 200 ohms/cm.

8. The article of claim 4 wherein said two or more layers differ in index of refraction by at least 0.10.

9. The article of claim 4 wherein said two or more layers are separated by an adhesive layer.

10. The article of claim 4 wherein said two or more layers comprises an electrical dielectric material.

11. The article of claim 4 wherein said two or more layers comprises an electrical gradient.

12. The article of claim 4 wherein said two or more layers are separated by a diffusion membrane.

13. The article of claim 4 wherein said channels further comprises a protective layer.

14. The article of claim 4 wherein said article further comprises an oriented polymer sheet located adjacent said two or more layers.

15. The article of claim 4 wherein said electronically conductive polymer material is selected from the group consisting of substituted or unsubstituted aniline containing polymers, substituted or unsubstituted pyrrole containing polymers, substituted or unsubstituted thiophene containing polymers.

16. The article of claim 4 wherein said electronically conductive polymer is selected from the group consisting of poly(3,4-ethylene dioxythiophene styrene sulfonate), poly (pyrrole styrene sulfonate) and poly(3,4-ethylene dioxypyrrole styrene sulfonate).

17. The article of claim 4 wherein said conductive material comprises a gelatin binder and metallic salt.

18. The article of claim 4 wherein said resistivity of the said conductive materials is less than 600 ohm meters.

19. The article of claim 4 wherein said resistivity of the said conductive materials is between 0.1 and 300 ohm meters.

20. The article of claim 4 wherein said conductive material wave guides visible light in the plane of the conduit.

21. The article of claim 4 wherein said article has a light transmission greater than 80%.

22. The article of claim 4 wherein said conduits have a depth of between 0.1 and 10 micrometers.

23. The article of claim 4 wherein said conduits have a frequency of from 1 to 1000 conduits/cm.

24. The article of claim 4 wherein said polymer sheet has a thickness between 20 and 120 micrometers.

25. The article of claim 4 wherein said plurality of conduits intersect at at least one intersection point.

26. The article of claim 4 wherein said plurality of conduits have at least one direction change greater than 30 degrees relative to the conduit starting direction.

27. The article of claim 4 wherein said conduits comprise nanocomposite layered particles.

28. The article of claim 27 wherein said layered particle comprises smectite clay.

29. The article of claim 28 wherein said smectite clay comprises an intercalant selected from the group consisting of ethoxylated alcohol, polyether-block-polyamide and poly (ethylene oxide-b-caprolactone).

30. The article of claim 4 wherein said polymer layer further comprises discrete polymer features.

31. The article of claim 4 further comprising an inkjet printed image adjacent to said conduits.

32. A transmissive display comprising the article of claim 4.

33. A process for forming an article of claim 4 comprising forming a polymeric layer with a desired pattern of conduits and then inserting two or more layers within the desired conduits to form the article of claim 4.

34. The process of claim 33 wherein a smoothing layer is placed between two of the inserted layers.

* * * * *